United States Patent
Jeong et al.

(10) Patent No.: US 8,766,300 B2
(45) Date of Patent: Jul. 1, 2014

(54) LIGHT EMITTING DEVICE, LIGHT EMITTING DEVICE PACKAGE COMPRISING THE SAME AND LIGHTING SYSTEM

(75) Inventors: Hwan Hee Jeong, Seoul (KR); Kwang Ki Choi, Seoul (KR); June O Song, Seoul (KR); Sang Youl Lee, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/189,226

(22) Filed: Jul. 22, 2011

(65) Prior Publication Data

US 2012/0018757 A1    Jan. 26, 2012

(30) Foreign Application Priority Data

Jul. 23, 2010 (KR) .................. 10-2010-0071461

(51) Int. Cl.
*H01L 21/33* (2006.01)
(52) U.S. Cl.
USPC .................. 257/98; 438/29; 257/E33.062
(58) Field of Classification Search
USPC .................. 257/E33.062, E33.011
See application file for complete search history.

(56) References Cited

U.S. PATENT DOCUMENTS

| | | | |
|---|---|---|---|
| 6,222,207 B1 | 4/2001 | Carter-Coman et al. | |
| 6,555,405 B2 * | 4/2003 | Chen et al. | 438/22 |
| 2003/0087463 A1 * | 5/2003 | Horng et al. | 438/29 |
| 2004/0066142 A1 * | 4/2004 | Stimac et al. | 315/50 |
| 2005/0030754 A1 * | 2/2005 | Licht | 362/433 |
| 2005/0194603 A1 * | 9/2005 | Slater et al. | 257/98 |
| 2005/0236639 A1 * | 10/2005 | Abe et al. | 257/100 |
| 2006/0163599 A1 * | 7/2006 | Tsai et al. | 257/99 |
| 2010/0123147 A1 | 5/2010 | Jeong | |

FOREIGN PATENT DOCUMENTS

| | | |
|---|---|---|
| JP | 2006-100500 A | 4/2006 |
| JP | 2007-81312 A | 3/2007 |
| KR | 10-2006-0059783 A | 6/2006 |
| KR | 10-2009-0116840 A | 11/2009 |
| KR | 10-2010-0023274 A | 3/2010 |
| KR | 10-2010-0072043 A | 6/2010 |

* cited by examiner

*Primary Examiner* — W. Wendy Kuo
*Assistant Examiner* — Shaka White
(74) *Attorney, Agent, or Firm* — Birch, Stewart, Kolasch & Birch, LLP

(57) ABSTRACT

Disclosed is a light emitting device including a light emitting structure including a first conductive semiconductor layer, an active layer and a second conductive semiconductor layer, a first electrode disposed on the first conductive semiconductor layer, a reflective electrode disposed on the second conductive semiconductor layer, a channel layer disposed on the light emitting structure and surrounds the reflective electrode, and a support substrate connected to the channel layer through an adhesive layer.

19 Claims, 8 Drawing Sheets

LIGHT EMITTING DEVICE, LIGHT EMITTING DEVICE PACKAGE COMPRISING THE SAME AND LIGHTING SYSTEM

This application claims the benefit of Korean Patent Application No. 10-2010-0071461, filed on Jul. 23, 2010, which is hereby incorporated by reference as if fully set forth herein.

BACKGROUND

1. Field

Embodiments relate to a light emitting device, a light emitting device package comprising the same and a lighting system.

2. Discussion of the Related Art

Light emitting devices such as light emitting diodes or laser diodes using Group III-V or II-VI compound semiconductor materials can realize a variety of colors such as red, green, blue and ultraviolet through development of thin film growth technologies and devices can realize white light at high efficiency using fluorescent materials or combining colors, and have advantages of low power consumption, semipermanent life span, rapid response speed, excellent safety and environmental friendliness, as compared to conventional light sources such as fluorescent lamps and incandescent lamps.

Accordingly, application of light emitting devices extends to transmission modules of optical communication equipment, light emitting diode backlights replacing cold cathode fluorescence lamps (CCFL) constituting backlights of liquid crystal display (LCD) devices, white light emitting diode lighting devices replacing fluorescent lamps or incandescent lamps, automobile head lights and traffic lights.

SUMMARY

Accordingly, the present embodiments is directed to a light emitting device, a light emitting device package comprising the same and a lighting system that substantially obviate one or more problems due to limitations and disadvantages of the related art.

Embodiments realize easy formation of a channel layer in a light emitting device and improve safety of the light emitting device.

To achieve the object and other advantages in accordance with the purpose of the embodiments, as embodied and broadly described herein, provided is a light emitting device including: a light emitting structure including a first conductive semiconductor layer, an active layer and a second conductive semiconductor layer; a first electrode disposed on the first conductive semiconductor layer; a reflective electrode disposed on the second conductive semiconductor layer; a channel layer disposed on the light emitting structure and surrounds the reflective electrode; and a support substrate connected to the channel layer through an adhesive layer.

The channel layer may be made of a metal and may be made of a material selected from the group consisting of Ti, Ni, Pt, Pd, Rh, Ir and W.

The light emitting device may further include a current blocking layer (CBL) partially disposed on the second conductive semiconductor layer.

The light emitting device may further include: an ohmic layer disposed on the CBL and the second conductive semiconductor layer.

The ohmic layer may surround the CBL.

The reflective electrode may surround the ohmic layer.

The ohmic layer may be made of a material selected from the group consisting of ITO, AZO, IZO, Ni, Pt and Ag.

The ohmic layer may be separated into at least two unit ohmic layers and the reflective electrode is provided on each unit ohmic layer.

The support substrate may be made of a material selected from the group consisting of Mo, Si, W, Cu and Al.

The first electrode may be made of a material selected from the group consisting of Ti, Ni, Pt, Pd, Rh, Ir and W.

The adhesive layer may be made of a material selected from the group consisting of In, Sn, Ag, Nb, Ni, Au and Al.

The channel layer may surround the reflective electrode.

The light emitting device may further include a passivation layer to surround the side of the light emitting structure and the channel layer may separate the passivation layer from the reflective electrode.

The passivation layer may contact the channel layer at the outer surface of the light emitting structure.

The channel layer may come in contact with the light emitting structure in at least one region.

In accordance with another aspect of the present embodiments, provided is a light emitting device package including: a body provided with a cavity; a first lead frame and a second lead frame provided on the body; and a light emitting device provided on the body and electrically connected to the first lead frame and the second lead frame, wherein the light emitting device includes: a light emitting structure including a first conductive semiconductor layer, an active layer and a second conductive semiconductor layer; a first electrode disposed on the first conductive semiconductor layer; a reflective electrode disposed on the second conductive semiconductor layer; a channel layer disposed on the light emitting structure and surrounds the reflective electrode; and a support substrate connected to the channel layer through an adhesive layer.

The channel layer may be selected from the group consisting of Ti, Ni, Pt, Pd, Rh, Ir and W.

The light emitting device package may further include: a current blocking layer (CBL) partially disposed on the second conductive semiconductor layer; and an ohmic layer disposed on the CBL and the second conductive semiconductor layer, wherein the ohmic layer is separated into at least two unit ohmic layers and the reflective electrode is provided on each unit ohmic layer.

In accordance with another aspect of the present embodiments, provided is a lighting system including: a light emitting device package; a circuit substrate electrically connected to the light emitting device package; a substrate to support the light emitting device package and the circuit substrate; and an optical member to transfer light emitted from the light emitting device package, wherein the light emitting device package includes: a body provided with a cavity; a first lead frame and a second lead frame provided on the body; and a light emitting device provided on the body and electrically connected to the first lead frame and the second lead frame, wherein the light emitting device includes: a light emitting structure including a first conductive semiconductor layer, an active layer and a second conductive semiconductor layer; a first electrode disposed on the first conductive semiconductor layer; a reflective electrode disposed on the second conductive semiconductor layer; a channel layer disposed on the light emitting structure and surrounds the reflective electrode; and a support substrate connected to the channel layer through an adhesive layer.

It is to be understood that both the foregoing general description and the following detailed description of the present embodiments are exemplary and explanatory and are intended to provide further explanation of the invention as claimed.

BRIEF DESCRIPTION OF THE DRAWINGS

The accompanying drawings, which are included to provide a further understanding of the embodiments and are incorporated in and constitute a part of this application, illustrate embodiment(s) of the invention and along with the description serve to explain the principle of the embodiments. In the drawings.

DETAILED DESCRIPTION OF THE EMBODIMENTS

Figure 1:
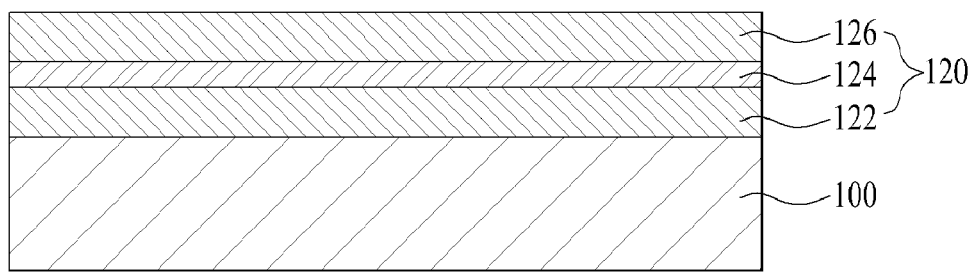
FIGS. 1 to 8 are sectional views illustrating a process for manufacturing a light emitting device according to one embodiment.

Reference will now be made in detail to preferred embodiments, examples of which are illustrated in the accompanying drawings.

Prior to description of the embodiments, it will be understood that, when an element is referred to as being formed "on or under" another element, the two elements may directly contact each other or may be indirectly disposed such that at least one intervening element is interposed therebetween. Further, the term "on or under" with reference to an element may mean "on" as well as "under" the element.

In the drawings, the thicknesses or sizes of respective layers are exaggerated, omitted or schematically illustrated for clarity and convenience of description. Therefore, the sizes of respective elements do not wholly reflect actual sizes thereof.

FIGS. 1 to 8 are sectional views illustrating a process for manufacturing a light emitting device according to one embodiment. Hereinafter, the method for manufacturing a light emitting device according to one embodiment will be described.

First, as shown in FIG. 1, a light emitting structure 120 including a buffer layer (not shown), a first conductive semiconductor layer 122, an active layer 124 and a second conductive semiconductor layer 126 is formed on a substrate 100.

The light emitting structure 120 may be formed by a method such as metal organic chemical vapor deposition (MOCVD), chemical vapor deposition (CVD), plasma-enhanced chemical vapor deposition (PECVD), molecular beam epitaxy (MBE) and hydride vapor phase epitaxy (HVPE), without being limited thereto.

The substrate 100 includes a conductive substrate or an insulating substrate and is for example made of at least one of sapphire ($Al_2O_3$), SiC, GaAs, GaN, ZnO, Si, GaP, InP, Ge, and Ga2O3. The substrate 100 may be provided at the top thereof with a roughness and the present embodiments is not limited thereto. The substrate 100 is wet-washed to remove impurities present on the surface thereof.

A buffer layer (not shown) may be grown between the light emitting structure and the substrate 100 to reduce lattice mismatch and differences in coefficient of thermal expansion. The buffer layer may be made of at least one of Group III-V or II-VI compound semiconductor materials such as GaN, InN, AlN, InGaN, AlGaN, InAlGaN and AlInN. An undoped semiconductor layer may be formed on the buffer layer, but the present embodiments is not limited thereto.

The first conductive semiconductor layer 122 may be realized with a Group III-V or II-VI compound semiconductor doped with a first conductive dopant, and when the first conductive semiconductor layer 122 is an n-type semiconductor layer, the first conductive dopant for example includes Si, Ge, Sn, Se or Te as an n-type dopant, although the dopant is not limited thereto.

The first conductive semiconductor layer 122 may contain a semiconductor material having formula of $Al_xIn_yGa_{(1-x-y)}N$ ($0 \leq x \leq 1, 0 \leq y \leq 1, 0 \leq x+y \leq 1$). The first conductive semiconductor layer 122 may be made of at least one of GaN, InN, AlN, InGaN, AlGaN, InAlGaN, AlInN, AlGaAs, InGaAs, AlInGaAs, GaP, AlGaP, InGaP, AlInGaP and InP.

The active layer 124 is a layer in which electrons injected through the first conductive semiconductor layer 122 are combined with holes injected through the subsequently formed second conductive semiconductor layer 126 to emit light having an energy determined by the inherent energy band of the material for the active layer (light emitting layer).

The active layer 124 may have at least one of mono-quantum well structures, multi-quantum well (MQW) structures, quantum wire structures and quantum dot structures. For example, the active layer 120 may have a multi-quantum well structure formed by injecting trimethyl gallium gas (TMGa), ammonia gas ($NH_3$), nitrogen gas ($N_2$), or trimethyl indium gas (TMIn) and the material for active layer 120 is not limited thereto.

The well layer/barrier layer of the active layer 124 may have at least one pair structure of InGaN/GaN, InGaN/InGaN, GaN/AlGaN, InAlGaN/GaN, GaAs(InGaAs)/AlGaAs and GaP(InGaP)/AlGaP and the material is not limited thereto. The well layer may be made of a material having a lower band gap than the barrier layer.

A conductive clad layer (not shown) may be formed on and/or under the active layer 124. The conductive clad layer may be made of an AlGaN-based semiconductor and the active layer 124 may have a higher band gap than the barrier layer.

The second conductive semiconductor layer 126 may contain a Group III-V or II-VI compound semiconductor doped with a second conductive dopant, such as a semiconductor material having formula of $In_xAl_yGa_{1-x-y}N$ ($0 \leq x \leq 1, 0 \leq y \leq 1, 0 \leq x+y \leq 1$). When the second conductive semiconductor layer 124 is a p-type semiconductor layer, the second conductive dopant may include Mg, Zn, Ca, Sr or Ba as a p-type dopant.

Figure 2:
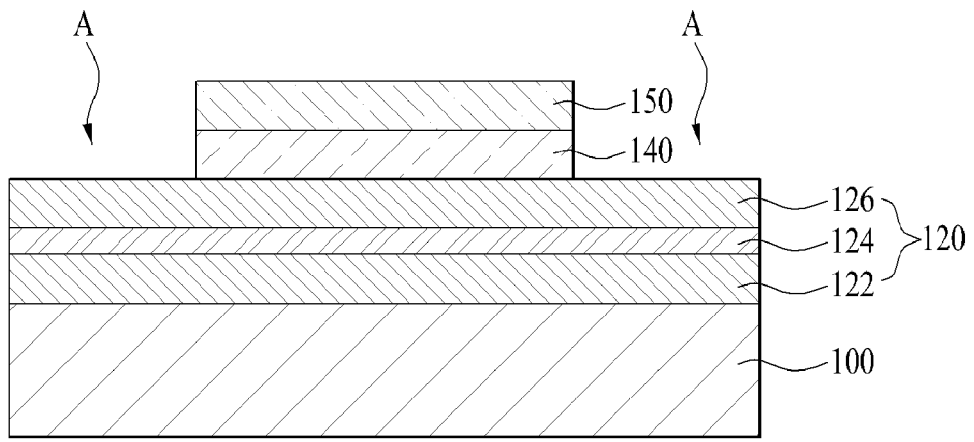

As shown in FIG. 2, an ohmic layer 140 and a reflective layer 150 are formed on the light emitting structure 120. The light emitting structure 120, in particular, the second conductive semiconductor layer 126 has a low impurity doping concentration and thus a high contact resistance and may thus exhibit deteriorated ohmic properties with metal. In order to improve these ohmic properties, the ohmic layer 140 may be formed by sputtering or electron-beam deposition. The ohmic layer 140 is formed between the light emitting structure 120 and the reflective layer 150 and may be thus a transparent electrode or the like.

The ohmic layer 140 may have a thickness of about 200 angstroms. The ohmic layer 140 contains at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, IrOx, RuOx, NiO, RuOx/ITO, Ni/IrOx/Au, and Ni/IrOx/Au/ITO, Ag, Ni, Cr, Ti, Al, Rh, Pd, Ir, Sn, In, Ru, Mg, Zn, Pt, Au, Hf and the material for the ohmic layer 140 IGZO is not limited thereto.

The reflective layer 150 may have a thickness of about 2,500 angstroms. The reflective layer 150 is a metal layer made of aluminum (Al), silver (Ag), nickel (Ni), platinum (Pt), rhodium (Rh), or an alloy containing Al, Ag, Pt or Rh. The aluminum, silver or the like effectively reflects light emitted from the active layer 124 and considerably improves light extraction efficiency of the light emitting device.

Figure 3:
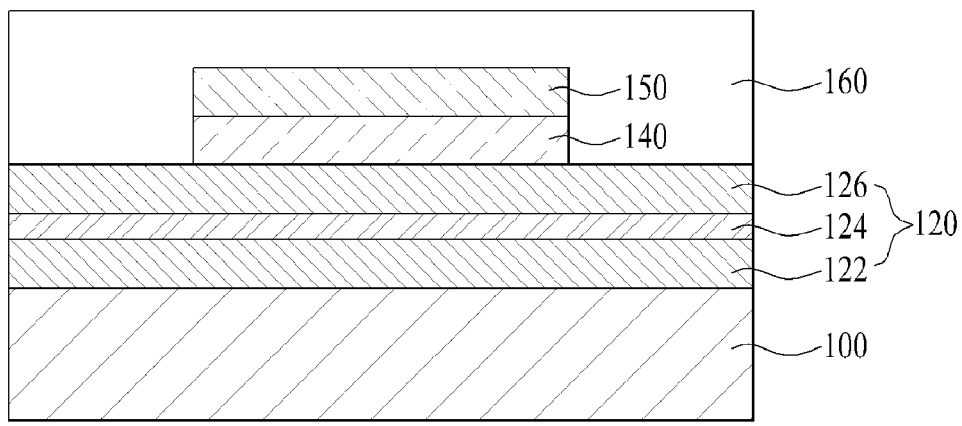

In addition, as shown in FIG. 3, a channel layer 160 may be formed on the surfaces of the reflective layer 150 and the exposed light emitting structure 120. The channel layer 160 surrounds the reflective electrode. The channel layer 160 may be made of a metal and specifically may be made of a material selected from the group consisting of Ti, Ni, Pt, Pd, Rh, Ir and W. The alloy may be an alloy of titanium and nickel, or an alloy of titanium and platinum. The channel layer 160 is formed over the entirety of the light emitting device, that is, over regions where the ohmic layer 140 and the reflective layer 150 are formed, as well as over channel regions where the light emitting structure 120 is exposed. The channel layer 160 may be formed by sputtering or electron-beam deposition using the mentioned material.

Figure 4:
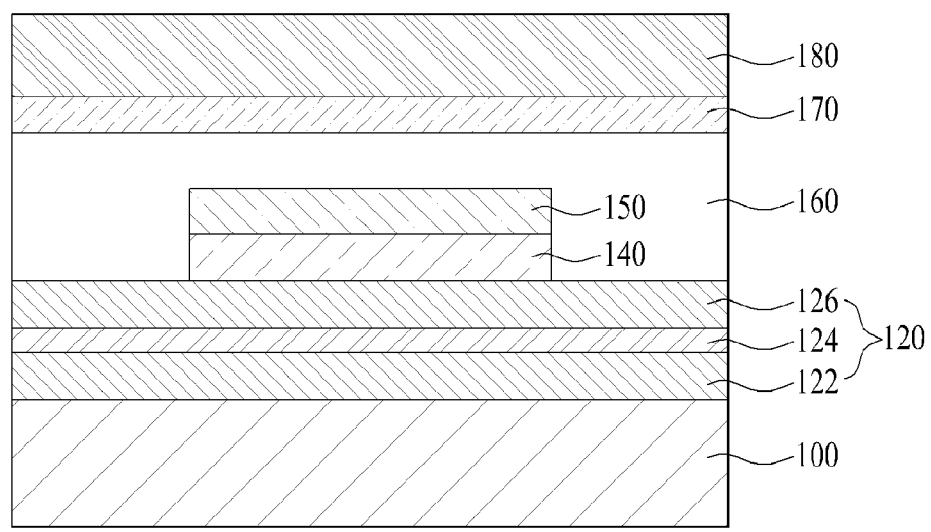

As shown in FIG. 4, an adhesive layer 170 and a conductive support substrate 180 may be formed on the channel layer 160. The conductive support substrate 180 may be formed by electrochemical metal deposition or bonding using a eutectic metal. A separate adhesive layer 170 may further be formed.

The conductive support substrate 180 may be made of a metal having superior electrical conductivity so that it can serve as a second electrode or of a metal having high thermal conductivity to sufficiently emit heat generated when the light emitting device operates.

The conductive support substrate 180 may be made of a material selected from the group consisting of molybdenum (Mo), silicon (Si), tungsten (W), copper (Cu), aluminum (Al) and alloys thereof. In addition, the conductive support substrate 180 may be selected from gold (Au), copper alloys, nickel (Ni), copper-tungsten (Cu—W) and carrier wafers (such as GaN, Si, Ge, GaAs, ZnO, SiGe, SiC, SiGe and Ga2O3).

In addition, the conductive support substrate 180 may have a sufficient mechanical strength so that it can be efficiently separated into respective chips through scribing and breaking processes without causing the light emitting structure containing a nitride semiconductor to warp.

The adhesive layer 170 connects the channel layer 160 to the conductive support substrate 180. The adhesive layer 170 may be made of a material selected from the group consisting of gold (Au), tin (Sn), indium (In), aluminum (Al), silicon (Si), silver (Ag), nickel (Ni), copper (Cu) and alloys thereof.

Figure 5:
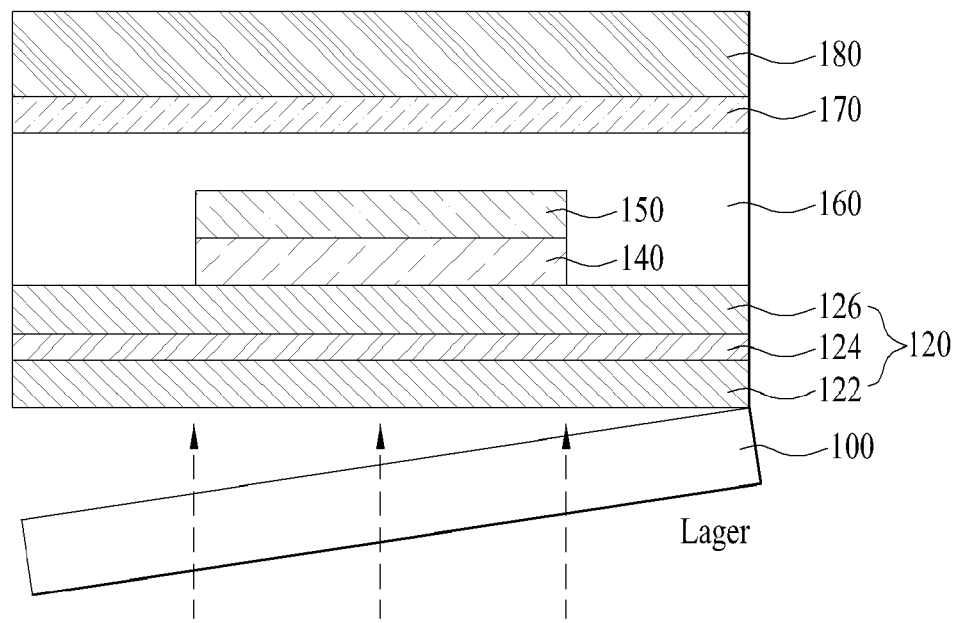

As shown in FIG. 5, the substrate 100 is separated. The removal of the substrate (110) may be performed by a laser lift off (LLO) method using an excimer laser or the like, or dry or wet etching.

In accordance with the laser lift off method, for example, when excimer laser light having a predetermined range of wavelength is focused and irradiated toward the substrate 100, heat energy concentrates on the interface between the substrate 100 and the light emitting structure 120 and the interface are separated into gallium and nitrogen molecules and the substrate 10 is instantly separated in regions through which laser light passes.

Figure 6:
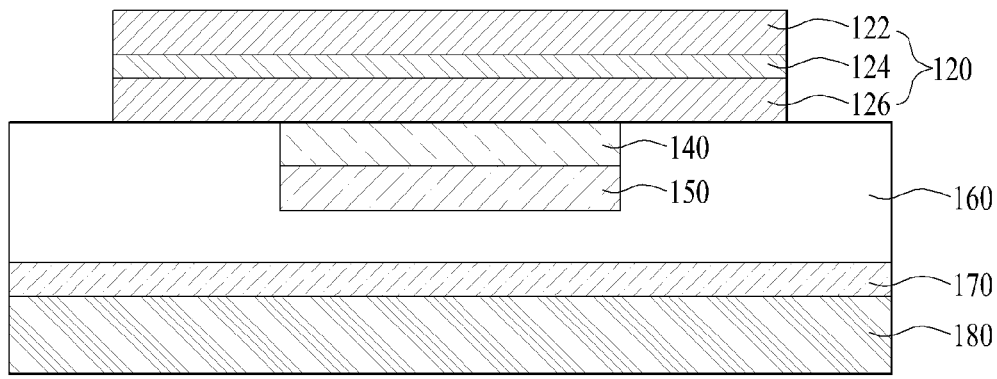

In addition, as shown in FIG. 6, the light emitting structure 120 is diced into unit light emitting devices. At this time, the light emitting structure 120 is etched and then removed, such that the width of the light emitting structure 120 is smaller than the width of the channel layer 160 in respective unit devices.

In FIG. 6, the channel layer 160 is entirely connected to the conductive support substrate 180, the light emitting structure 120 is disposed in a part of the channel layer 160, and the width of light emitting structure 120 is larger than the width of the ohmic layer 140 and the reflective layer 150.

Figure 7:
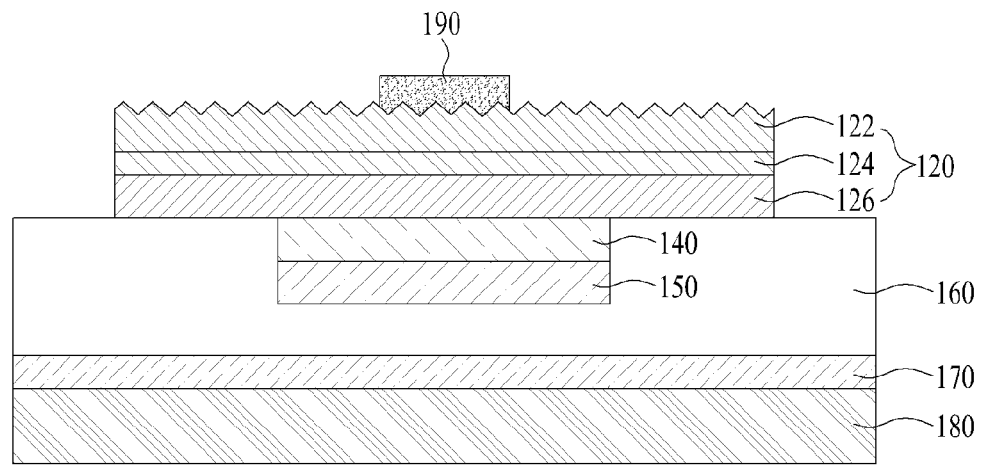

In addition, as shown in FIG. 7, the surface of the light emitting structure 120, that is, the surface of the exposed first conductive semiconductor layer 122 is etched. At this time, etching may be selectively performed through a mask on the surface of the light emitting structure 120 or be carried out by dry etching or wet etching using an etching liquid.

After the etching process, a roughness may be selectively formed on the surface of the light emitting structure 120. After the selective etching process, a part of the surface of the light emitting structure 120 may be flat.

A first electrode 190 may be formed on the first conductive semiconductor layer 122. The first electrode 190 may have a mono- or multi-layer structure containing at least one of aluminum (Al), titanium (Ti), chromium (Cr), nickel (Ni), copper (Cu) and gold (Au).

Figure 8:
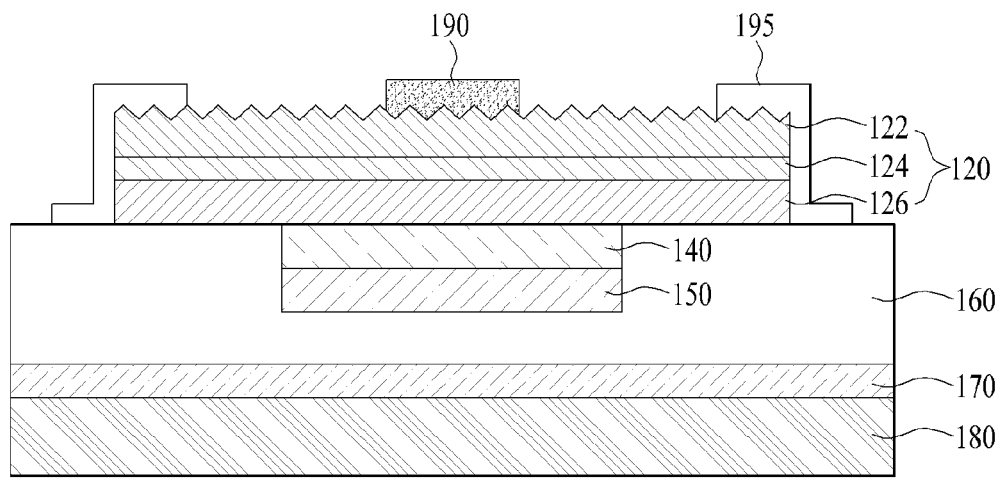

In addition, as shown in FIG. 8, a passivation layer 195 may be formed at the side of the light emitting structure 120.

The passivation layer 195 may be made of an insulating material and the insulating material contains non-conductive oxide or nitride. For example, the passivation layer 195 may be a silicon oxide ($SiO_2$) layer, an oxide nitride layer or an oxide aluminum layer.

In this embodiment, the first conductive semiconductor layer 122 is realized with a p-type semiconductor layer and the second conductive semiconductor layer 126 is realized with an n-type semiconductor layer. In addition, a semiconductor, (for example, an n-type semiconductor layer (not shown), in a case where the second conductive semiconductor layer is a p-type semiconductor layer) having polarity opposite to the second conductive semiconductor layer 126 may be formed on the second conductive semiconductor layer 126. Accordingly, the light emitting structure layer 115 may include at least one of N-P junction, P-N junction, N-P-N junction and P-N-P junction structures, although the junction structure thereof is not limited thereto.

Figure 9:
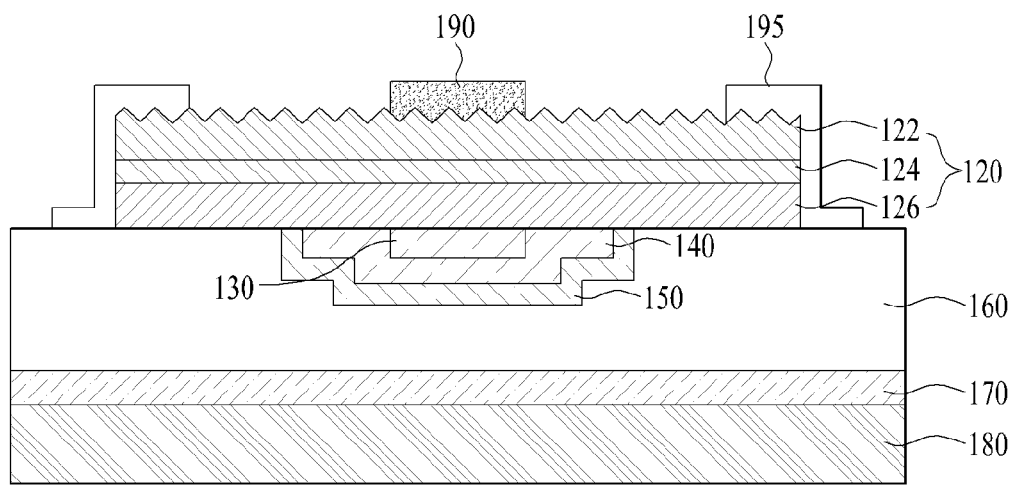
FIGS. 9 to 11 are sectional views illustrating a light emitting device according to another embodiment.
Figure 10:
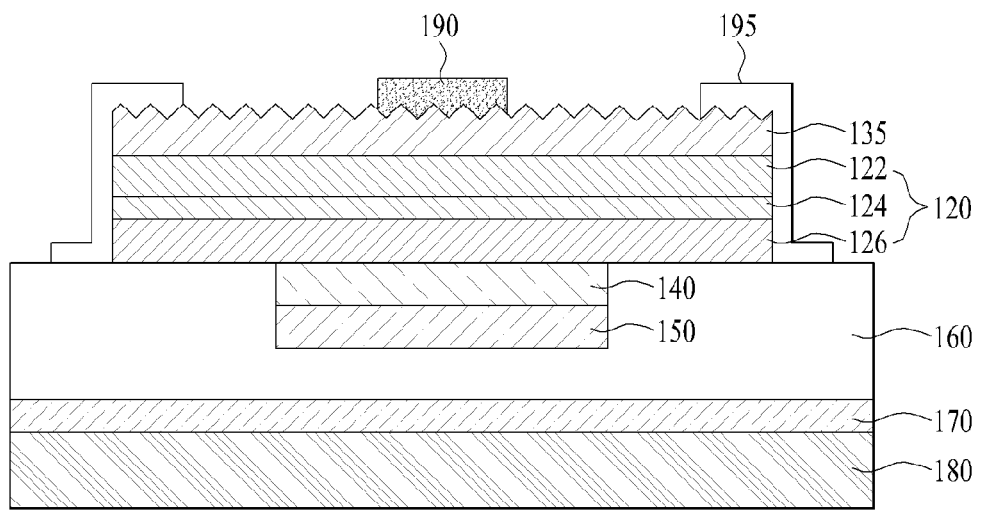
Figure 11:
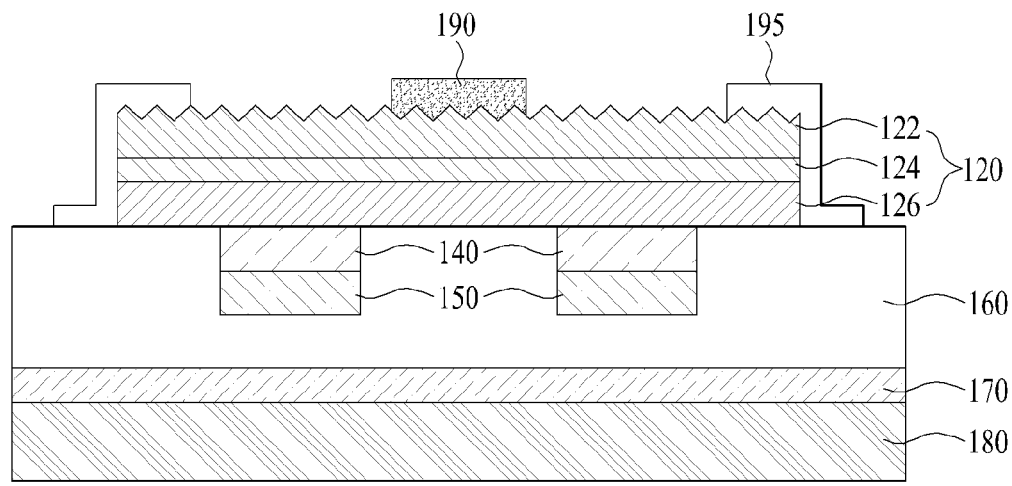

FIGS. 9 to 11 are sectional views illustrating a light emitting device according to another embodiment.

In the embodiment shown in FIG. 9, a current blocking layer (CBL) 130 as an insulating material is formed between the light emitting structure 120 and the reflective electrode 140. CBL 130 prevents current from concentrating at specific regions, that is, central regions, of the light emitting structure 120 and thus allows light to be emitted from the entirety of the active layer 124. The CBL 130 may be disposed in the central region of the light emitting device or disposed in a region where the first electrode 190 is formed.

In addition, the ohmic layer 140 surrounds the CBL 130 and the reflective layer 150 surrounds the ohmic layer 140.

In the embodiment shown in FIG. 10, a nitride semiconductor layer 195 having roughness is formed on the light emitting structure 120, in particular, the first conductive semiconductor layer 122. The nitride semiconductor layer 195 having a roughness may be grown by a method such as MOCVD and grown under different three-dimensional growth accerlation conditions.

That is, the roughness may be formed by partially increasing/decreasing the growth rate of the first conductive semiconductor layer 122, partially increasing/decreasing the growth temperature thereof or treating the surface thereof with magnesium nitride (MgN$_x$) or silicon nitride (SiN$_x$). In addition, the roughness may be formed by forming the first conductive semiconductor layer 122 to a larger thickness, followed by etching using wet-etching.

In this embodiment, roughness having a pyramidal shape is formed on the surface of the light emitting device to reduce the amount of light which is total-reflected and consumed in the device, after the light emitted from the active layer 124 reaches the surface of the device and thereby to improve light extraction efficiency of the light emitting device.

FIG. 11 is a sectional view illustrating a light emitting device according to another embodiment.

In this embodiment, the ohmic layer 140 is separated into two unit ohmic layers and the reflective layer 150 is also formed on each unit ohmic layer. The ohmic layer 140 and the reflective layer 150 are separated into respective unit layers. That is, the ohmic layer 140 is separated on one light emitting structure 120. And, The channel layer 160 may act as a CBL (current blocking layer).

At this time, formation of the ohmic layer 140 may be performed by depositing a material selected from the group consisting of ITO, AZO, IZO, Ni, Pt and Ag, followed by patterning, or selectively depositing the material through a mask.

In the light emitting device according to this embodiment, the channel layer is formed using oxide or metal in channel regions as well as the entirety of the light emitting device and may be further not patterned.

Figure 12:
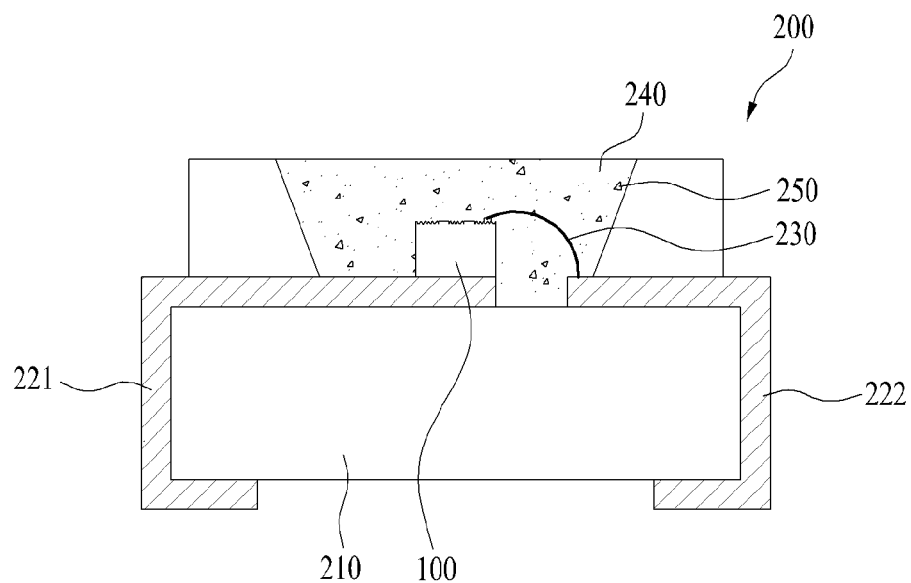
FIG. 12 is a sectional view illustrating a light emitting device package including the light emitting device according to another embodiment.

FIG. 12 is a sectional view illustrating a light emitting device package including the light emitting device according to one embodiment.

In this embodiment, the light emitting device package 200 includes a body 210 provided with a cavity, a first lead frame 221 and a second lead frame 222 provided on the body 210, a light emitting device 100 according to the afore-mentioned embodiments provided on the body 210, and the light emitting device 100 electrically connected to the first lead frame 221 and the second lead frame 222, and a molding member 130 provided in the cavity.

The body 210 contains silicon, a synthetic resin or a metal. When the body 210 is made of a conductive material such as metal, although not shown, an insulating material is coated on the surface of the body 210 to prevent short-circuit between the first and second lead frames 221 and 222.

The first lead frame 221 and second lead frame 222 are electrically separated and supply electric current to the light emitting device 100. In addition, the first lead frame 221 and the second lead frame 222 reflect light emitted the light emitting device 100 to improve optical efficiency and discharge heat generated in the light emitting device 100.

The light emitting device 100 may be provided on the body 210, the first lead frame 221 or the second lead frame 222. In this embodiment, the first lead frame 221 and the light emitting device 100 directly communicate with each other, and the second lead frame 222 and the light emitting device 100 are connected to each other through a wire 230. The light emitting device 100 may be connected to the lead frames 221 and 222 by wire bonding, flip chip bonding or die-bonding.

The molding member 240 surrounds the light emitting device 100 to protect the same. In addition, the molding member 240 includes a phosphor 250 and can thus vary the wavelength of light emitted by the light emitting device 100.

A first wavelength region of light emitted from the light emitting device 100 is excited by the phosphor 250 and is transformed into a second wavelength region of light, the second wavelength range of light passes through a lens (not shown) to vary a light passage.

A plurality of the light emitting device packages related to this embodiment are arrayed on a substrate, and optical members, i.e., light guide plates, prism sheets, diffusion sheets, or the like may be disposed in the light passage of the light emitting device packages. The light emitting device package, substrate and optical members may serve as light units. Another embodiment is realized with a display device, indicator and lighting system including the semiconductor light emitting device or light emitting device package mentioned in the previous embodiments and examples of the lighting system may include lamps, street lights and the like.

Hereinafter, a lighting device, as a lighting system including the light emitting device package, and a backlight unit will be described.

Figure 13:
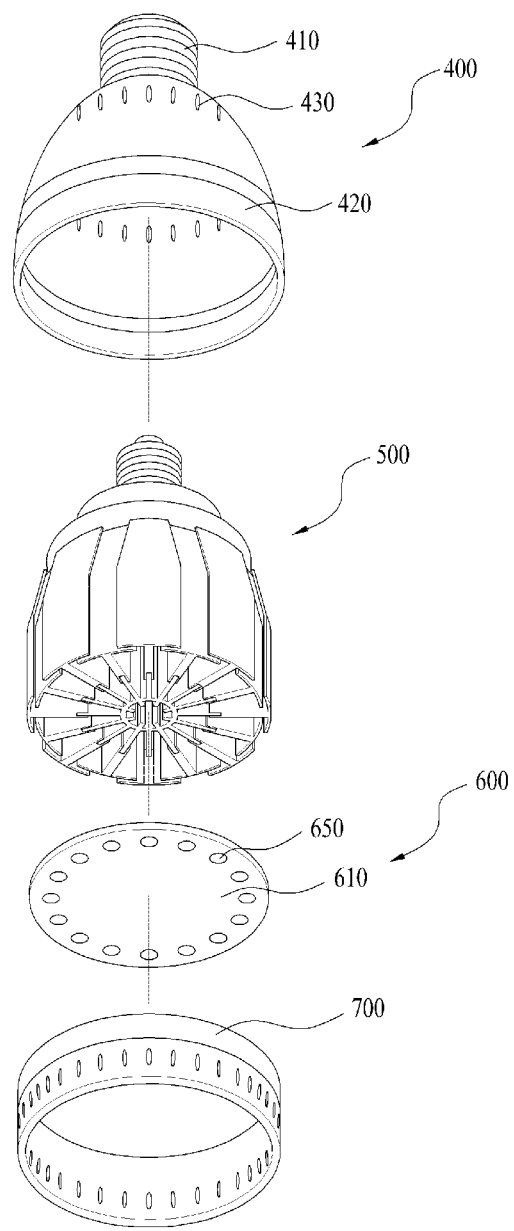
FIG. 13 is an exploded perspective view illustrating a lighting device including the light emitting device package according to one embodiment.

FIG. 13 is an exploded perspective view illustrating a lighting device including the light emitting device package according to one embodiment.

In this embodiment, the lighting device includes a light source 600, a housing 400 including the light source 600, a radiator 500 to emit heat of the light source 600, and a holder 700 to connect the light source 600 and the radiator 500 to the housing 400.

The housing 400 includes a socket connector 410 connected to an electric socket (not shown) and a body member 420 connected to the socket connector 410 wherein the body member 420 includes a light source 600. The body member 420 may be provided with an air passage hole 430.

The body member 420 of the housing 400 is provided on the surface thereof with a plurality of air passage holes 430. The air passage hole 430 may be provided as one air passage hole or a plurality of radially disposed passage holes, as illustrated in the drawing. The passage holes may be provided in other arrangement.

The light source 600 includes a circuit substrate 610 and a plurality of the light emitting device packages 650 disposed thereon. The circuit substrate 610 has a shape which may be inserted into an opening of the housing 400 and is made of a material having high thermal conductivity to transfer heat to the radiator 500.

A holder 700 is provided under the light source and may include a frame and another air passage hole. In addition, although not shown, optical members are provided under the light source 100 to diffuse, scatter or converge light projected by the light emitting device package 150 of the light source 100.

Figure 14:
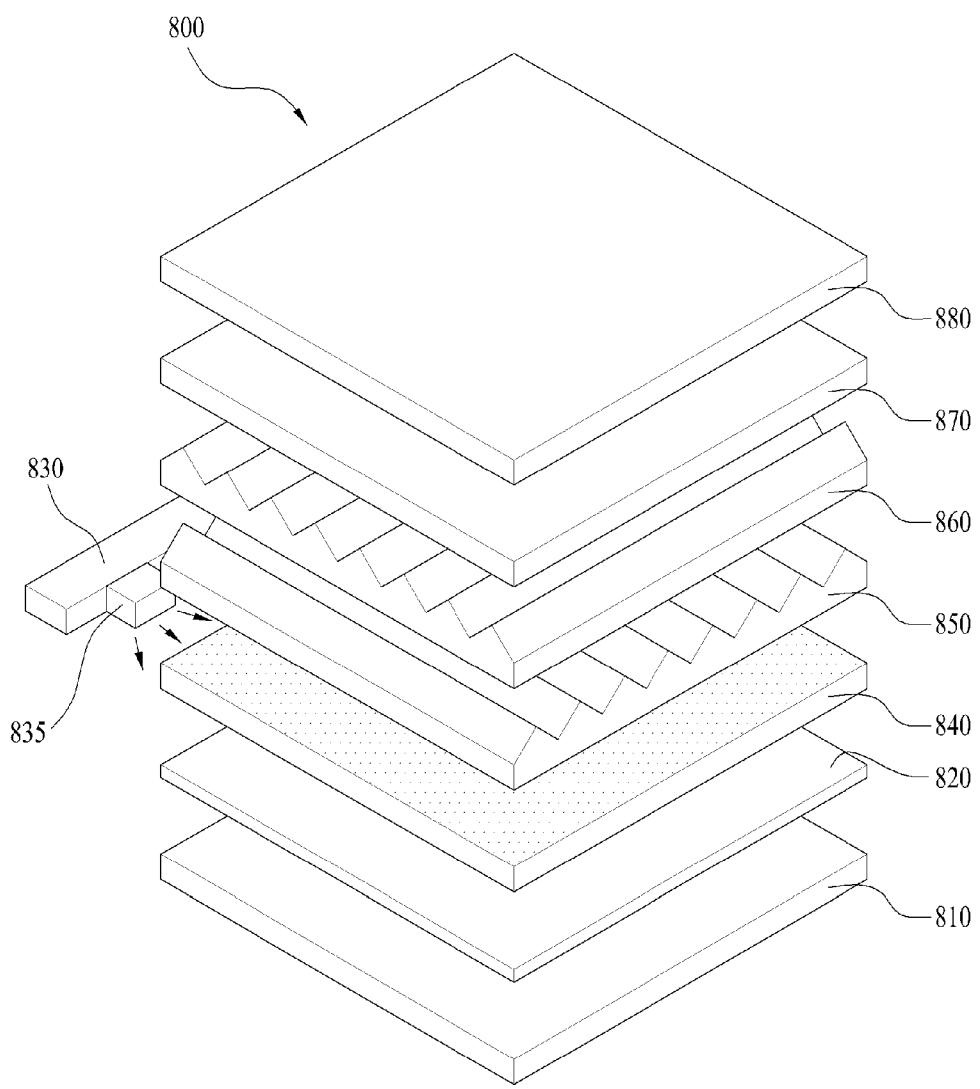
FIG. 14 is a view illustrating a display device including the light emitting device package according to one embodiment.

FIG. 14 is a view illustrating a display device including the light emitting device package according to one embodiment.

As illustrated in the drawing, the display device 800 according to this embodiment includes light source modules 830 and 835, a reflective plate 820 serving as a bottom cover 820, a light guide plate 840 disposed in front of the reflective plate 820 to direct light emitted the light source module toward the front of display device, a first prism sheet 850 and a second prism sheet 860 disposed in front of the light guide plate 840, a panel 870 disposed in front of the second prism sheet 860 and a color filter 880 disposed in front of the panel 870.

The light source module includes a circuit substrate 830 and a light emitting device package 835 disposed thereon. The circuit substrate 830 may be PCB or the like and the light emitting device package 835 is as illustrated above with reference to FIG. 13.

The bottom cover 810 may accept constituent components of the display device 800. The reflective plate 820 may be provided as a separate element, as illustrated in the drawing, or as a coating having a high reflectivity provided on the back surface of the light guide plate 840 or the front surface of the bottom cover 810.

Here, the reflective plate 820 may be made of a highly reflective material which may be used in an ultrathin shape and examples thereof include polyethylene terephtalate (PET).

The light guide plate 840 scatters light emitted from the light emitting device package module, and uniformly distributes the light over the entirety of the screen of liquid crystal display devices. Accordingly, the light guide plate 840 is made of a highly reflective and transmitting material and examples thereof include polymethylmethacrylate (PMMA), polycarbonate (PC) and polyethylene (PE). In addition, the light guide plate is not formed and an air guide manner in which light is transferred in the space provided above the reflective plate is possible.

The first prism sheet 850 is formed at one side of a support film using a light-transmitting and elastic polymer and the polymer may include a prism layer having a plurality of repeatedly formed three-dimensional structures. Here, the plurality of patterns, as illustrated in the drawing, may be provided as stripe patterns in which grooves and ribs repeatedly alternate.

A direction of ribs and grooves disposed on one side of the support film in the second prism sheet 860 may be vertical to a direction of ribs and grooves disposed on one side of a support film in the first prism sheet 850 so that light transferred from the light source module and the reflective plate can be uniformly distributed in all directions of the panel 870.

In this embodiment, the first prism sheet 850 and the second prism sheet 860 constitute optical sheets and the optical sheets may be for example provided as a micro lens array, a combination of one or more diffusion sheets and a micro lens array, or a combination of one prism sheet and a micro lens array.

The panel 870 may be a liquid crystal panel and other display devices requiring a light source may be disposed instead of the liquid crystal panel 860.

The panel 870 includes upper and lower glass bodies, liquid crystal sealed between the glass bodies and a polarization plate disposed on each glass body to polarize light. The liquid crystal has intermediate properties between a liquid and a solid. Liquid crystal has a state in which organic molecules which are flowable like liquid are regularly disposed like a crystal. The molecular arrangement of liquid crystal is varied by applied electric field, to display an image.

The liquid crystal panel used for display devices is in an active matrix mode and uses a transistor as a switch to control voltage supplied to respective pixels.

A color filter 880 is provided in front of the panel 870 and respective pixels transmit only red, green and blue of light among light emitted from the panel 870 to display an image.

As apparent from the fore-going, according to the light emitting device, the light emitting device package comprising the same and lighting system of the mentioned embodiments, the channel layer is formed over the entirety of the light emitting device, requiring no separate patterning and improving adhesion between electrodes and adhesive layers.

It will be apparent to those skilled in the art that various modifications and variations can be made in the present embodiments without departing from the spirit or scope of the embodiments. Thus, it is intended that the present embodiments covers the modifications and variations of this embodiments provided they come within the scope of the appended claims and their equivalents.

What is claimed is:

1. A light emitting device comprising:
    a light emitting structure including a first conductive semiconductor layer, an active layer and a second conductive semiconductor layer;
    a first electrode disposed on the first conductive semiconductor layer;
    an ohmic layer disposed on the second conductive semiconductor layer;
    a reflective electrode disposed on the ohmic layer;
    a channel layer disposed on the light emitting structure and surrounding the ohmic layer and the reflective electrode; and
    a support substrate connected to the channel layer through an adhesive layer,
    wherein the ohmic layer is separated into at least two unit ohmic layers and the reflective electrode is provided on each unit ohmic layer, and
    wherein the channel layer directly contacts the light emitting structure in a region disposed between adjacent unit ohmic layers.

2. The light emitting device according to claim 1, wherein the channel layer is made of a metal.

3. The light emitting device according to claim 2, wherein the channel layer is made of a material selected from the group consisting of titanium (Ti), nickel (Ni), platinum (Pt), palladium (Pd), rhodium (Rh), iridium (Ir) and tungsten (W).

4. The light emitting device according to claim 1, further comprising a current blocking layer (CBL) partially disposed between the second conductive semiconductor layer and the ohmic layer.

5. The light emitting device according to claim 4, wherein the ohmic layer surrounds the CBL.

6. The light emitting device according to claim 1, wherein the reflective electrode surrounds the ohmic layer.

7. The light emitting device according to claim 1, wherein the ohmic layer is made of a material selected from the group consisting of indium tin oxide (ITO), aluminum zinc oxide (AZO), indium zinc oxide (IZO), nickel (Ni), platinum (Pt) and silver (Ag).

8. The light emitting device according to claim 1, wherein the support substrate is made of a material selected from the group consisting of molybdenum (Mo), silicon (Si), tungsten (W), copper (Cu) and aluminum (Al).

9. The light emitting device according to claim 1, wherein the first electrode is made of a material selected from the group consisting of titanium (Ti), nickel (Ni), platinum (Pt), palladium (Pd), rhodium (Rh), iridium (Ir) and tungsten (W).

10. The light emitting device according to claim 1, wherein the adhesive layer is made of a material selected from the group consisting of indium (In), stannum (Sn), silver (Ag), niobium (Nb), nickel (Ni), aurum (Au) and aluminum (Al).

11. The light emitting device according to claim 1, further comprising a passivation layer to surround the side of the light emitting structure, and the channel layer separates the passivation layer from the reflective electrode.

12. The light emitting device according to claim 11, wherein the passivation layer contacts the channel layer at the outer surface of the light emitting structure.

13. The light emitting device according to claim 1, wherein the channel layer comes in contact with the light emitting structure in at least one region.

14. A light emitting device package comprising:
    a body provided with a cavity;
    a first lead frame and a second lead frame provided on the body; and a light emitting device provided on the body and electrically connected to the first lead frame and the second lead frame,
wherein the light emitting device includes:
a light emitting structure including a first conductive semiconductor layer, an active layer and a second conductive semiconductor layer;
a first electrode disposed on the first conductive semiconductor layer;
a current blocking layer (CBL) disposed on the second conductive semiconductor layer;
an ohmic layer disposed on the second conductive semiconductor layer;
a reflective electrode disposed on the ohmic layer;
a channel layer disposed on the light emitting structure and surrounds the reflective electrode; and
a support substrate connected to the channel layer through an adhesive layer,
wherein the ohmic layer has a groove, and the current blocking layer is disposed in the groove in the ohmic layer, and
wherein a lower surface of the current blocking layer, a portion of a lower surface of the ohmic layer and a portion of a lower surface of the reflective layer directly contact one surface of the light emitting structure.

15. The light emitting device package according to claim 14, wherein the channel layer is selected from the group consisting of titanium (Ti), nickel (Ni), platinum (Pt), palladium (Pd), rhodium (Rh), iridium (Ir) and tungsten (W).

16. A lighting system comprising:
a light emitting device package;
a circuit substrate electrically connected to the light emitting device package; and
a substrate to support the light emitting device package and the circuit substrate,
wherein the light emitting device package includes:
a body provided with a cavity;
a first lead frame and a second lead frame provided on the body; and
a light emitting device provided on the body and electrically connected to the first lead frame and the second lead frame,
wherein the light emitting device includes:
a light emitting structure including a first conductive semiconductor layer, an active layer and a second conductive semiconductor layer;
a first electrode disposed on the first conductive semiconductor layer;
an ohmic layer disposed on the second conductive semiconductor layer;
a reflective electrode disposed on ohmic layer;
a channel layer disposed on the light emitting structure and surrounding the ohmic layer and the reflective electrode; and
a support substrate connected to the channel layer through an adhesive layer,
wherein the ohmic layer is separated into at least two unit ohmic layers and the reflective electrode is provided on each unit ohmic layer, and
wherein the channel layer directly contacts the light emitting structure in a region disposed between adjacent unit ohmic layers.

17. The light emitting device according to claim 1, wherein the channel layer has at least two grooves, and
wherein each of the unit ohmic layers is disposed in each groove.

18. The light emitting device according to claim 1, wherein the ohmic layer includes a groove,
wherein the reflective electrode is disposed in the groove, and
wherein the reflective electrode is disposed between the ohmic layer and the channel layer.

19. The light emitting device according to claim 1, wherein the ohmic layer is disposed between the light emitting structure and the reflective electrode.

* * * * *